(12) United States Patent
Chow et al.

(10) Patent No.: US 7,872,345 B2
(45) Date of Patent: Jan. 18, 2011

(54) INTEGRATED CIRCUIT PACKAGE SYSTEM WITH RIGID LOCKING LEAD

(75) Inventors: Seng Guan Chow, Singapore (SG); Linda Pei Ee Chua, Singapore (SG); Heap Hoe Kuan, Singapore (SG)

(73) Assignee: Stats Chippac Ltd., Sinapore (SG)

( * ) Notice: Subject to any disclaimer, the term of this patent is extended or adjusted under 35 U.S.C. 154(b) by 281 days.

(21) Appl. No.: 12/055,642

(22) Filed: Mar. 26, 2008

(65) Prior Publication Data

US 2009/0243077 A1    Oct. 1, 2009

(51) Int. Cl.
*H01L 23/48* (2006.01)

(52) U.S. Cl. ............ 257/690; 257/670; 257/701; 257/702; 257/787; 257/E23.034; 257/E23.068; 257/E23.086

(58) Field of Classification Search ......... 257/666–733, 257/E23.001–E23.194, 782, 784, 778, 787; 438/111, 112, 123, FOR. 366, FOR. 367, 438/FOR. 377, FOR. 380, 126; 361/697.57
See application file for complete search history.

(56) References Cited

U.S. PATENT DOCUMENTS

| 6,072,239 | A | 6/2000 | Yoneda et al. |
| 6,528,877 | B2 * | 3/2003 | Ernst et al. ............ 257/707 |
| 6,635,957 | B2 | 10/2003 | Kwan et al. |
| 6,770,959 | B2 | 8/2004 | Huang et al. |
| 6,774,499 | B1 | 8/2004 | Yang |

* cited by examiner

*Primary Examiner*—Jasmine J Clark
(74) *Attorney, Agent, or Firm*—Mikio Ishimaru

(57) ABSTRACT

An integrated circuit package system includes: providing a protective layer having an opening; forming a conductive layer over the protective layer and filling the opening; patterning a rigid locking lead, having both a lead locking portion and a lead exposed portion, from the conductive layer; connecting an integrated circuit and the rigid locking lead; and forming an encapsulation over the integrated circuit with the lead locking portion in the encapsulation and the lead exposed portion exposed from the encapsulation.

18 Claims, 7 Drawing Sheets

INTEGRATED CIRCUIT PACKAGE SYSTEM WITH RIGID LOCKING LEAD

TECHNICAL FIELD

The present invention relates generally to integrated circuit package system and more particularly to an integrated circuit package system having a shield.

BACKGROUND ART

Modern consumer electronics, such as smart phones, personal digital assistants, and location based services devices, as well as enterprise electronics, such as servers and storage arrays, are packing more integrated circuits into an ever-shrinking physical space with expectations for decreasing cost. Every new generation of integrated circuits with increased operating frequency, performance and the higher level of large-scale integration have underscored the need for back-end integrated circuit manufacturing to provide more solutions involving the integrated circuit itself. Numerous technologies have been developed to meet these requirements. Some of the research and development strategies focus on new package technologies while others focus on improving the existing and mature package technologies.

Semiconductor package structures continue to advance toward miniaturization and thinning to increase the density of the components that are packaged therein while decreasing the sizes of the products that are made therefrom. This is in response to continually increasing demands on information and communication apparatus for ever-reduced sizes, thicknesses, and costs along with ever-increasing performance.

These increasing requirements for miniaturization are particularly noteworthy, for example, in portable information and communication devices such as cellular phones, hands-free cellular phone headsets, personal data assistants ("PDA's"), camcorders, notebook personal computers, and so forth. All of these devices continue to be made smaller and thinner to improve their portability. Accordingly, large-scale IC ("LSI") packages that are incorporated into these devices are required to be made smaller and thinner. The package configurations that house and protect LSI require them to be made smaller and thinner as well.

Many conventional semiconductor die (or "chip") packages are of the type where a semiconductor die is molded into a package with a resin, such as an epoxy molding compound. The packages have a lead frame whose leads are projected from the package body, to provide a path for signal transfer between the die and external devices. Other conventional package configurations have contact terminals or pads formed directly on the surface of the package.

Such a conventional semiconductor package is fabricated through the following processes: a die-bonding process (mounting the semiconductor die onto the paddle of a lead frame), a wire-bonding process (electrically connecting the semiconductor die on the paddle to inner leads using lead frame wires), a molding process (encapsulating a predetermined portion of the assembly, containing the die, inner leads and lead frame wires, with an epoxy resin to form a package body), and a trimming process (completing each assembly as individual, independent packages).

The semiconductor packages, thus manufactured, are then mounted by matching and soldering the external leads or contact pads thereof to a matching pattern on a circuit board, to thereby enable power and signal input/output ("I/O") operations between the semiconductor devices in the packages and the circuit board.

An exemplary semiconductor package, well known in the electronics industry, is the quad flat nonleaded ("QFN") package. QFN packages typically include a lead frame, such as a conductive sheet stamped and etched, with a semiconductor die having a multitude of bond pads mounted to the top side of the lead frame. Wire bonds electrically connect the bond pads, of the semiconductor die, to a series of conductive lead fingers on the topside of the lead frame. Typically, the semiconductor die and the wire bonds are encapsulated within a molding compound.

In order to reduce manufacturing costs, the electronics industry is increasing the usage of QFN packages. In the manufacturing process, many obstacles must be overcome to deliver extremely small packages with thinner and thinner profile in high volume. Despite the trend towards miniaturization and thinner profile, more functions and more integrated circuits continue to be packed into QFN packages. Typical QFN solutions face problems providing the high density and high count I/O needed for modern electronic products.

Thus, a need still remains for an integrated circuit package system providing low cost manufacturing, improved yield, improved reliability, and high density I/O count. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides an integrated circuit package system including: providing a protective layer having an opening; forming a conductive layer over the protective layer and filling the opening; patterning a rigid locking lead, having both a lead locking portion and a lead exposed portion, from the conductive layer; connecting an integrated circuit and the rigid locking lead; and forming an encapsulation over the integrated circuit with the lead locking portion in the encapsulation and the lead exposed portion exposed from the encapsulation.

Certain embodiments of the invention have other aspects in addition to or in place of those mentioned or obvious from the above. The aspects will become apparent to those skilled in the art from a reading of the following detailed description when taken with reference to the accompanying drawings.

BEST MODE FOR CARRYING OUT THE INVENTION

Figure 1:
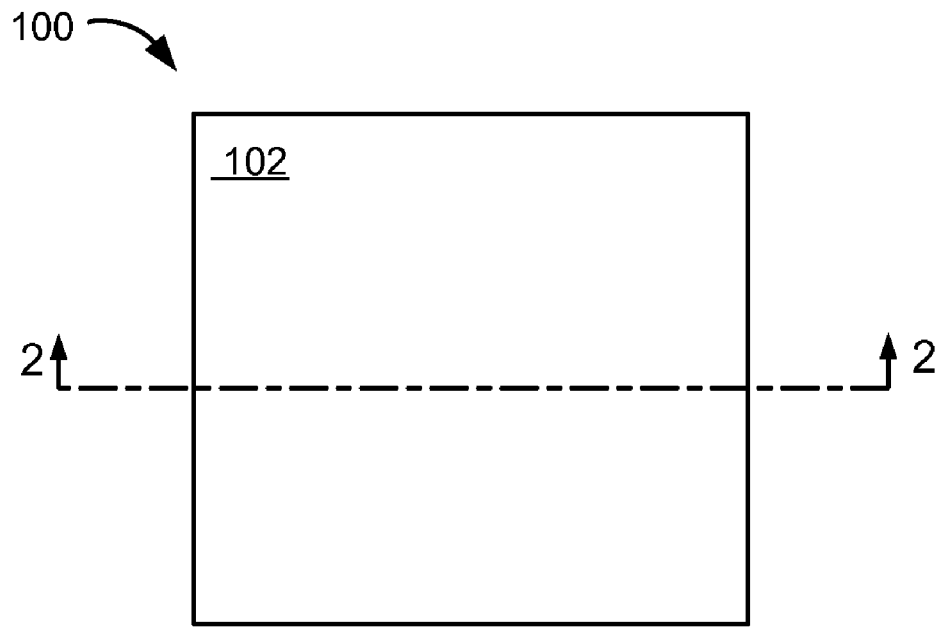
FIG. 1 is a top view of an integrated circuit package system in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGs. Generally, the invention can be operated in any orientation.

In addition, where multiple embodiments are disclosed and described having some features in common, for clarity and ease of illustration, description, and comprehension thereof, similar and like features one to another will ordinarily be described with like reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane.

The term "on" means there is direct contact among elements. The term "processing" as used herein includes deposition of material, patterning, exposure, development, etching, cleaning, molding, and/or removal of the material or as required in forming a described structure. The term "system" as used herein means and refers to the method and to the apparatus of the present invention in accordance with the context in which the term is used.

Referring now to FIG. 1, therein is shown a top view of an integrated circuit package system 100 in a first embodiment of the present invention. The top view depicts an encapsulation 102, such as a cover of an epoxy molding compound. For illustrative purposes, the integrated circuit package system 100 is shown with the encapsulation 102 in a geometric shape of a square, although it is understood that the integrated circuit package system 100 can have the encapsulation 102 in a different configuration. For example, the encapsulation 102 can be in a rectangular configuration.

Figure 2:
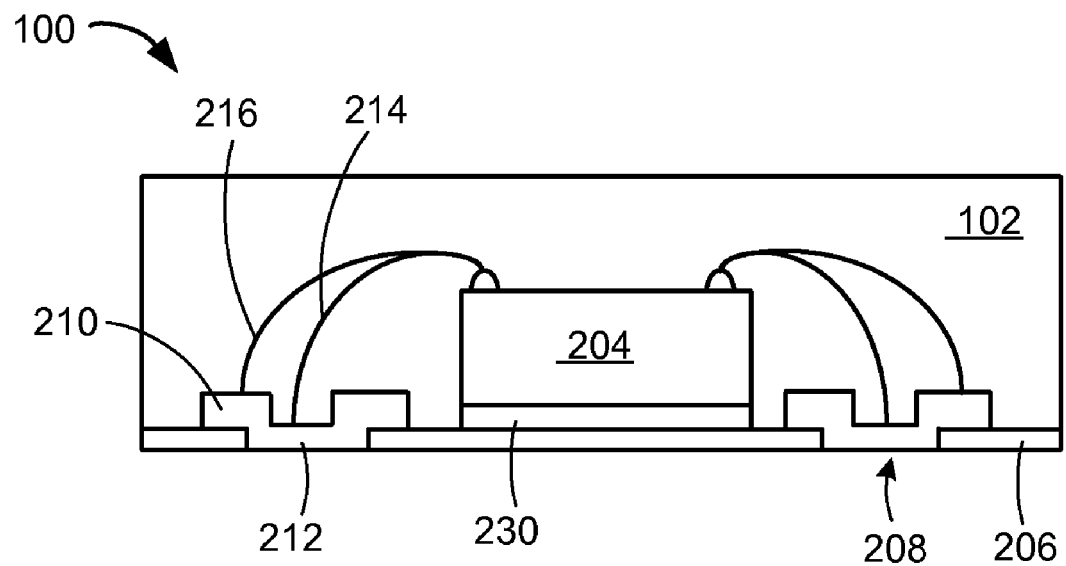
FIG. 2 is a cross-sectional view of the integrated circuit package system along line 2-2 of FIG. 1.

Referring now to FIG. 2, therein is shown a cross-sectional view of the integrated circuit package system 100 along line 2-2 of FIG. 1. The cross-sectional view depicts an integrated circuit 204, such as an integrated circuit die, mounts over a protective layer 206, such as an insulative support layer having a high modulus greater than 19 gigapascals (GPa), with an adhesive 230, such as a die-attach adhesive. A specific example of the protective layer 206 is high modulus epoxy molding compound greater than 19 GPa. The integrated circuit 204 can be between rigid locking leads 208.

For example, the rigid locking leads 208 can be formed in a U-shaped terminal. The rigid locking leads 208 can be formed of a single material and layer or can be formed with multiple layers, such as gold (Au), palladium (Pd), nickel (Ni), silver (Ag), tin (Sn), an alloy, or any combination thereof. Each of the rigid locking leads 208 includes a lead locking portion 210 and a lead exposed portion 212. The lead exposed portion 212 preferably located within an interior region of the rigid locking leads 208. The lead locking portion 210 preferably extend from and above the lead exposed portion 212. The lead locking portion 210 is over the protective layer 206 and within the encapsulation 102. The protective layer 206 can provide structural support for the integrated circuit package system 100 and for locking the rigid locking leads 208.

The lead locking portion 210 and the lead exposed portion 212 can increase the adhesion between the rigid locking leads 208 and the encapsulation 102 creating the locking effect for the rigid locking leads 208 preventing separation from the integrated circuit package system 100. The lead exposed portion 212 can connect to the next system level (not shown), such as a printed circuit board or another integrated circuit package system.

First interconnects 214, such as bond wires or ribbon bond wires, can be between the integrated circuit 204 and the lead exposed portion 212. Second interconnects 216, such as bond wires or ribbon bond wires, can be between the integrated circuit 204 and the lead locking portion 210.

For illustrative purposes, the integrated circuit package system 100 is shown with the first interconnects 214 and the second interconnects 216 both connecting to the same connection of the integrated circuit 204, although it is understood that the integrated circuit package system 100 can have different connections. For example, the first interconnects 214 and the second interconnects 216 can connect to different portions of the integrated circuit 204.

Also for illustrative purposes, the integrated circuit package system 100 is shown with the first interconnects 214 and the second interconnects 216 for connecting the integrated circuit 204 with the rigid locking leads 208, although it is understood that the integrated circuit package system 100 can have a different configuration. For example, the integrated circuit package system 100 can use the first interconnects 214 without the second interconnects 216 or the second interconnects 216 without the first interconnects 214.

The encapsulation 102 can be over the integrated circuit 204, the first interconnects 214, the second interconnects 216, the protective layer 206, and the rigid locking leads 208. The lead exposed portion 212 can be coplanar with the protective layer 206.

For illustrative purposes, the integrated circuit package system 100 is shown with the lead exposed portion 212 coplanar with the protective layer 206, although it is understood that the integrated circuit package system 100 can have different configuration of the rigid locking leads 208, the protective layer 206, or a combination thereof. For example, the lead exposed portion 212 can be non-planar with the protective layer 206 and extend below the protective layer 206.

As another example, the protective layer 206 may not cover the bottom side of the integrated circuit package system 100 to expose the rigid locking leads 208. The protective layer 206 can be selectively located, such as supporting the lead locking portion 210 and adjacent to the lead exposed portion 212. The bottom side of the integrated circuit package system 100 can have the encapsulation 102 or the adhesive 230 exposed.

Figure 3:
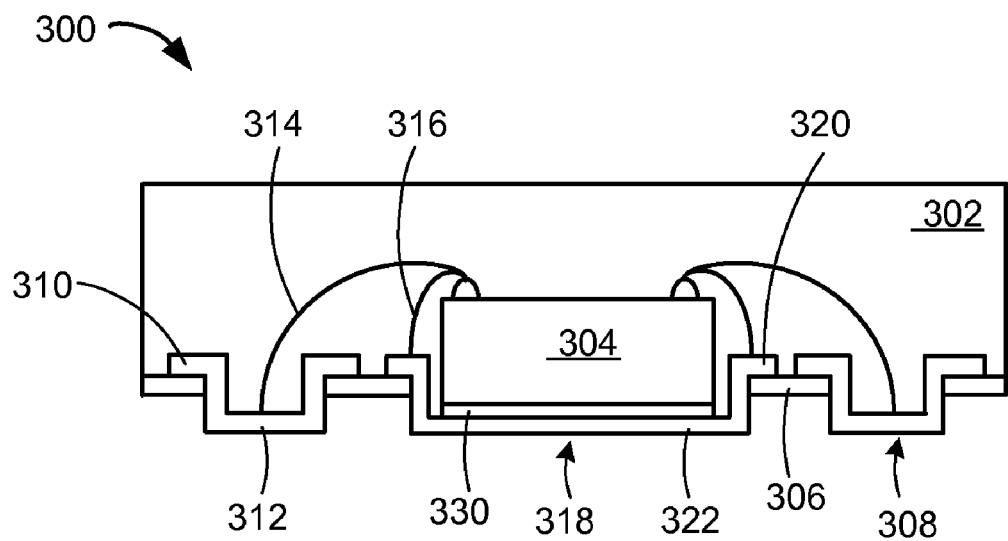
FIG. 3 is a cross-sectional view of an integrated circuit package system similar to FIG. 2 in a second embodiment of the present invention.

Referring now to FIG. 3, therein is shown a cross-sectional view of an integrated circuit package system 300 similar to FIG. 2 in a second embodiment of the present invention. The integrated circuit package system 300 includes structural similarities to the integrated circuit package system 100 of FIG. 2.

The cross-sectional view depicts an integrated circuit 304, such as an integrated circuit die, over a paddle 318, such as die-attach paddle. The paddle 318 can be between rigid locking leads 308. For example, the paddle 318 and the rigid locking leads 308 can be formed in a U-shaped terminal. The paddle 318 includes a paddle locking portion 320 and a paddle exposed portion 322.

Each of the rigid locking leads 308 includes a lead locking portion 310 and a lead exposed portion 312. The lead exposed portion 312 preferably located within an interior region of the rigid locking leads 308. The lead locking portion 310 preferably extend from and above the lead exposed portion 312.

The paddle 318 and the rigid locking leads 308 can be formed of a single material and layer or can be formed with multiple layers, such as gold (Au), palladium (Pd), nickel (Ni), silver (Ag), tin (Sn), an alloy, or any combination thereof. For example, the paddle 318 and the rigid locking leads 308 can be formed with different materials and layers.

The lead locking portion 310 and the paddle locking portion 320 can be over a protective layer 306, such as an insulative support layer having a high modulus greater than 19 GPa. A specific example of the protective layer 306 is high modulus epoxy molding compound greater than 19 GPa.

For illustrative purposes, the integrated circuit package system 300 is shown with the paddle 318, although it is understood that the integrated circuit package system 300 may not have the paddle 318. For example, the integrated circuit 304 can mount over the protective layer 306 with an adhesive 330, such as a die-attach adhesive, wherein the protective layer 306 can be planar between the rigid locking leads 308.

The lead locking portion 310 is over the protective layer 306 and within an encapsulation 302, such as a cover of an epoxy molding compound. The paddle locking portion 320 can also be over the protective layer 306 and within the encapsulation 302. The protective layer 306 can provide structural support for the integrated circuit package system 100 and for locking the rigid locking leads 308 as well as the paddle 318.

The lead locking portion 310 and the paddle locking portion 320 can increase the adhesion between the rigid locking leads 308 and the paddle 318 with the encapsulation 302 creating the locking effect for the rigid locking leads 308 and the paddle 318. The lead exposed portion 312 can connect to the next system level (not shown), such as a printed circuit board or another integrated circuit package system.

The paddle exposed portion 322 can serve different functions. The paddle 318 can improve thermal performance of the integrated circuit package system 100 by dissipating heat to ambient. The paddle 318 can be connected to a voltage reference plane, such as a ground or power connection First interconnects 314, such as bond wires or ribbon bond wires, can be between the integrated circuit 304 and the rigid locking leads 308. Second interconnects 316, such as bond wires or ribbon bond wires, can be between the integrated circuit 304 and the paddle 318. The second interconnects 316 are optional.

For illustrative purposes, the integrated circuit package system 300 is shown with the first interconnects 314 and the second interconnects 316 both connecting to the same connection at the integrated circuit 304, although it is understood that the integrated circuit package system 100 can have different connections. For example, the first interconnects 314 and the second interconnects 316 can connect to different portions of the integrated circuit 304.

The encapsulation 302 can be over the integrated circuit 304, the first interconnects 314, the second interconnects 316, the protective layer 306, the paddle 318, and the rigid locking leads 308. The lead exposed portion 312, the paddle exposed portion 322, or a combination thereof can be non-planar with the protective layer 306 and extend below the protective layer 306.

For illustrative purposes, the integrated circuit package system 300 is shown with the lead exposed portion 312 non-planar with the protective layer 306, although it is understood that the integrated circuit package system 300 can have different configuration of the rigid locking leads 308, the protective layer 306, or a combination thereof. For example, the lead exposed portion 312 can be coplanar with the protective layer 306.

Also for illustrative purposes, the integrated circuit package system 300 is shown with the paddle exposed portion 322 non-planar with the protective layer 306, although it is understood that the integrated circuit package system 300 can have different configuration of the paddle 318, the protective layer 306, or a combination thereof. For example, the lead exposed portion 312 can be coplanar with the protective layer 306.

As another example, the protective layer 306 may not cover the bottom side of the integrated circuit package system 300 to expose the rigid locking leads 308 and the paddle 318. The protective layer 306 can be selectively located, such as supporting the lead locking portion 310 adjacent to the lead exposed portion 312 and supporting the paddle locking portion 320 adjacent to the paddle exposed portion 322. The bottom side of the integrated circuit package system 300 can have the encapsulation 302 or the adhesive 330 exposed.

Figure 4:
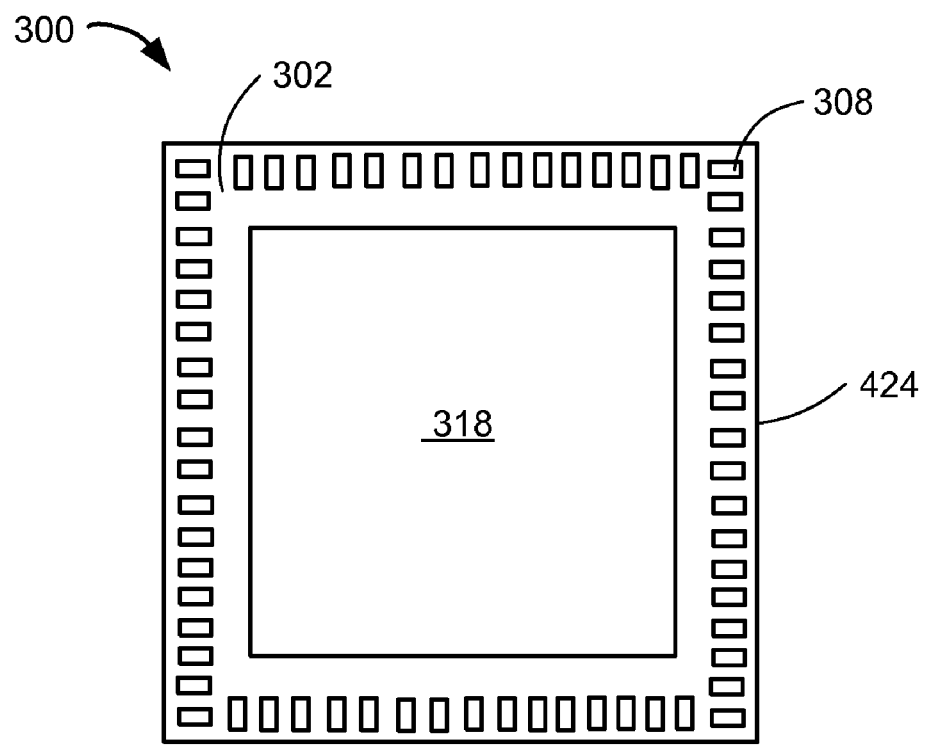
FIG. 4 is a bottom view of the integrated circuit package system of FIG. 3.

Referring now to FIG. 4, therein is shown a bottom view of the integrated circuit package system 300 of FIG. 3. The bottom view depicts one row of the rigid locking leads 308 along sides 424 of the integrated circuit package system 300. The paddle 318 can be exposed by the encapsulation 302 and surrounded by the rigid locking leads 308 at each of the sides 424. Without the paddle 318, the bottom view can depict the bottom view of the integrated circuit package system 100 of FIG. 2.

For illustrative purposes, the integrated circuit package system 300 is shown with one row of the rigid locking leads 308, although it is understood that the integrated circuit package system 300 can include a different configuration for the rigid locking leads 308. For example, the integrated circuit package system 300 can have more than one row of the rigid locking leads 308 or different number of rows of the rigid locking leads 308 along each of the sides 424.

As another example, the integrated circuit package system 300 may not have the rigid locking leads 308 along all the sides 424, such as along one of the sides 424 or along two of the sides 424. As a further example, the rigid locking leads 308 can be arranged in multiple rows in a staggered configuration.

Figure 5:
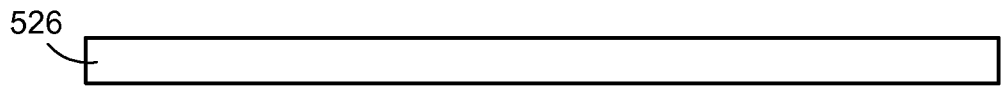
FIG. 5 is a cross-sectional view of a base structure.

Referring now to FIG. 5, therein is shown a cross-sectional view of a base structure 526. The base structure 526 can be formed from different materials. For example, the base structure 526 can include copper (Cu), aluminum (Al), a metal alloy, or polymer material.

Figure 6:
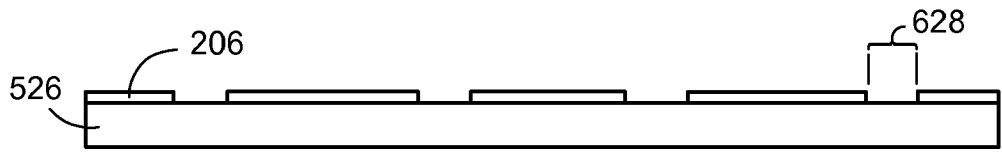
FIG. 6 is the structure of FIG. 5 in an attaching step of the protective layer.

Referring now to FIG. 6, therein is shown the structure of FIG. 5 in an attaching step of the protective layer 206. The protective layer 206 can be attached over the base structure 526. The protective layer 206 includes openings 628 exposing the base structure 526. The openings 628 may be formed in the protective layer 206 or formed with the protective layer 206 attached to the base structure 526.

Figure 7:
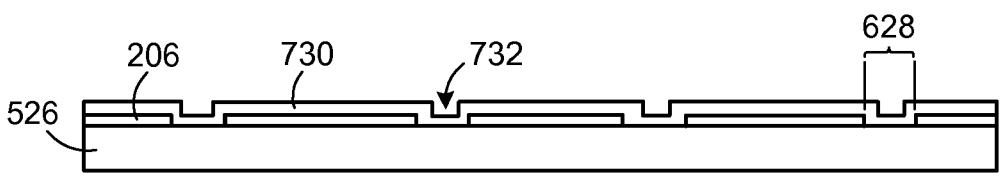
FIG. 7 is the structure of FIG. 6 in a forming step of a conductive layer.

Referring now to FIG. 7, therein is shown the structure of FIG. 6 in a forming step of a conductive layer 730. The conductive layer 730 is formed over the protective layer 206 and the base structure 526 filling in the openings 628 in the protective layer 206. The conductive layer 730 can form indentations 732 over the openings 628. The conductive layer 730 can be formed of a single material and layer or can be formed with multiple layers, such as gold (Au), palladium (Pd), nickel (Ni), silver (Ag), tin (Sn), an alloy, or any combination thereof. The conductive layer 730 can be applied with different processes, such as plating.

Figure 8:
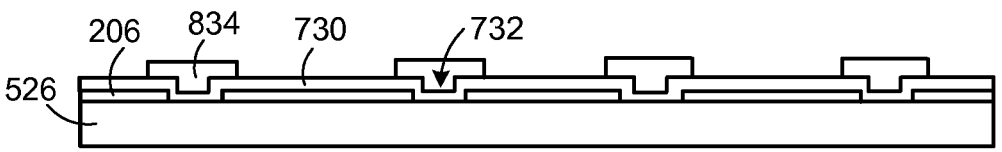
FIG. 8 is the structure of FIG. 7 in a forming step of a mask layer.

Referring now to FIG. 8, therein is shown the structure of FIG. 7 in a forming step of a mask layer 834. The mask layer 834, such as photoresist layer, can be patterned over the indentations 732 of the conductive layer 730. The mask layer 834 can also be over the protective layer 206 and the base structure 526.

Figure 9:
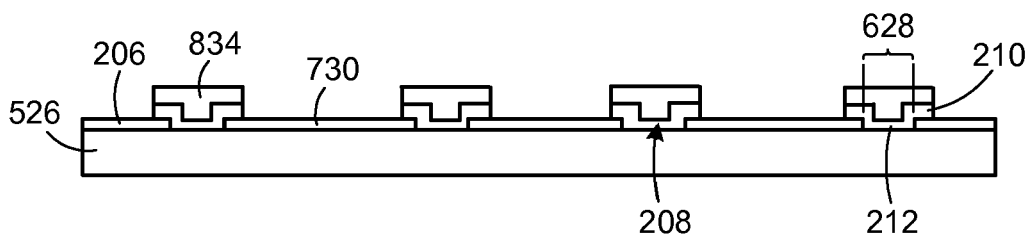
FIG. 9 is the structure of FIG. 8 in a patterning step of the rigid locking leads.

Referring now to FIG. 9, therein is shown the structure of FIG. 8 in a patterning step of the rigid locking leads 208. The mask layer 834 can be used to form or etch the conductive layer 730 of FIG. 8 for forming the rigid locking leads 208. The lead locking portion 210 is over the protective layer 206 and below the mask layer 834. The lead exposed portion 212 is in the openings 628 of the protective layer 206. The base structure 526 can be below the protective layer 206.

Figure 10:
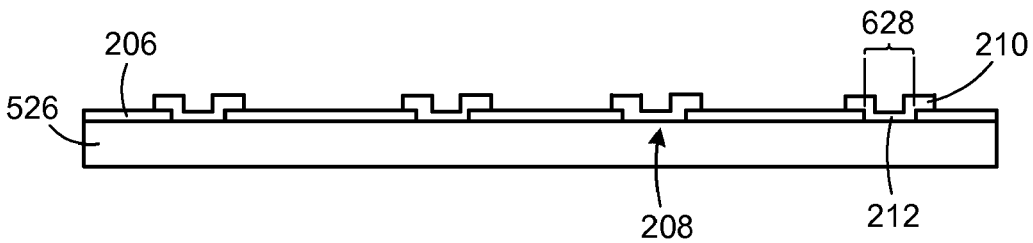
FIG. 10 is the structure of FIG. 9 in an exposing step of the rigid locking leads.

Referring now to FIG. 10, therein is shown the structure of FIG. 9 in an exposing step of the rigid locking leads 208. The mask layer 834 of FIG. 9 is removed exposing the rigid locking leads 208. As mentioned earlier, the lead locking portion 210 is over the protective layer 206 and the lead exposed portion 212 is within the openings 628 of the protective layer 206. The base structure 526 can be below the protective layer 206.

Figure 11:
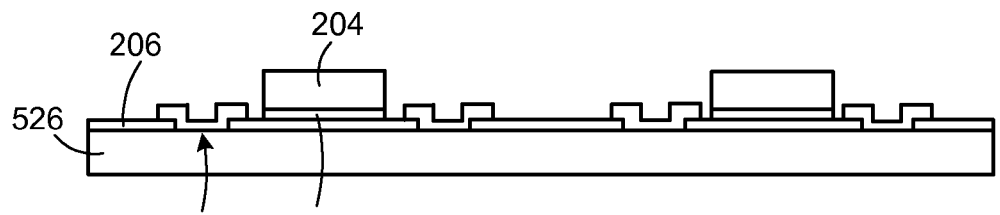
FIG. 11 is the structure of FIG. 10 in a mounting step of the integrated circuit.

Referring now to FIG. 11, therein is shown the structure of FIG. 10 in a mounting step of the integrated circuit 204. The integrated circuit 204 mounts over the protective layer 206 with an adhesive 1136, such as die-attach adhesive or thermal adhesive. The integrated circuit 204 can be between the rigid locking leads 208. The base structure 526 can be below the protective layer 206.

Figure 12:
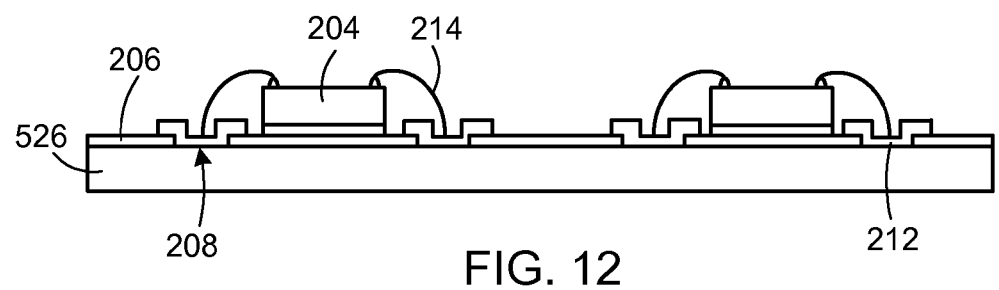
FIG. 12 is the structure of FIG. 11 in a connecting step of the first interconnects.

Referring now to FIG. 12, therein is shown the structure of FIG. 11 in a connecting step of the first interconnects 214. The first interconnects 214 can connect the integrated circuit 204 and the lead exposed portion 212 of the rigid locking leads 208. The integrated circuit 204 can be over the protective layer 206 and the base structure 526.

Figure 13:
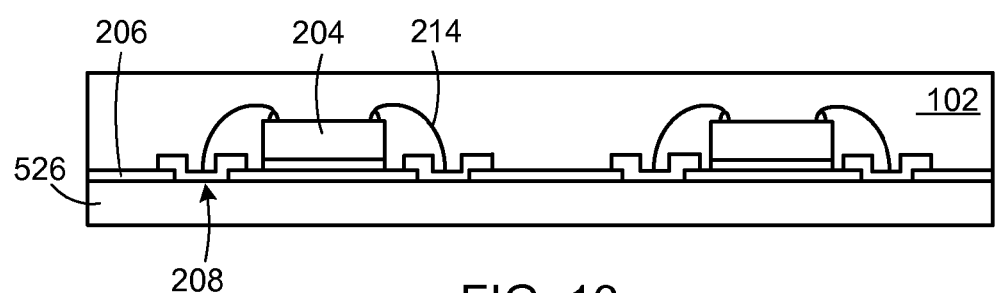
FIG. 13 is the structure of FIG. 12 in a molding step of the encapsulation.

Referring now to FIG. 13, therein is shown the structure of FIG. 12 in a molding step of the encapsulation 102. The encapsulation 102 can be formed over the integrated circuit 204, the first interconnects 214, the rigid locking leads 208, and the protective layer 206. The base structure 526 can be below the protective layer 206.

Figure 14:
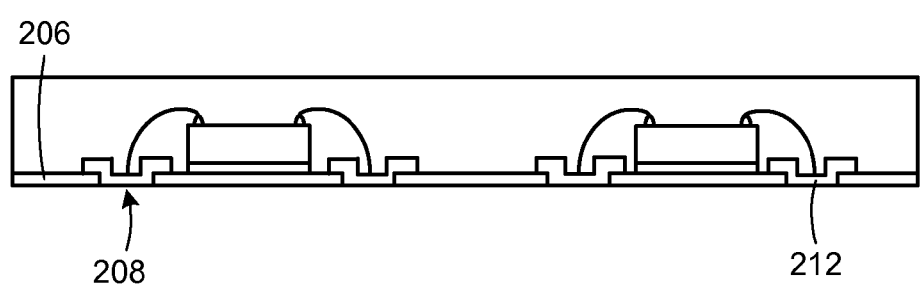
FIG. 14 is the structure of FIG. 13 in an exposing step of the rigid locking leads and the protective layer.

Referring now to FIG. 14, therein is shown the structure of FIG. 13 in an exposing step of the rigid locking leads 208 and the protective layer 206. The base structure 526 of FIG. 13 can be removed exposing the lead exposed portion 212 of the rigid locking leads 208 and the protective layer 206. The lead exposed portion 212 can be coplanar with the protective layer 206. The protective layer 206 can function to prevent warpage of the structure without the base structure 526.

It has been discovered that the present invention provide ultra thin profile for the integrated circuit package system by the protective layer having the high modulus characteristic preventing or mitigating warpage. The protective layer also provides warpage mitigation and prevention to the end product.

Figure 15:
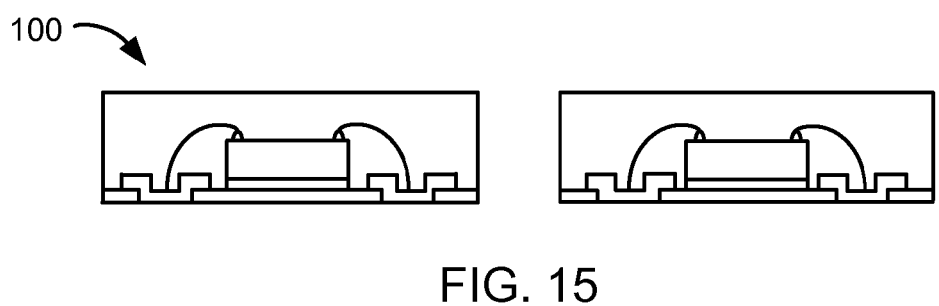
FIG. 15 is the structure of FIG. 14 in a forming step of the integrated circuit package system of FIG. 2.

Referring now to FIG. 15, therein is shown the structure of FIG. 14 in a forming step of the integrated circuit package system 100 of FIG. 2. The structure of FIG. 14 can undergo a singulation process separating the integrated circuit package system 100. The integrated circuit package system 100 is shown without the second interconnects 216 of FIG. 2.

Figure 16:
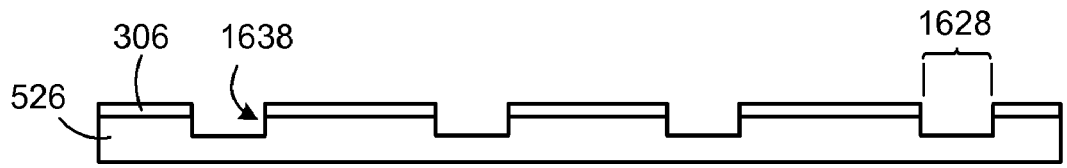
FIG. 16 is the structure of FIG. 6 in a forming step of recesses in the base structure.

Referring now to FIG. 16 is the structure of FIG. 6 in a forming step of recesses 1638 in the base structure 526. The recesses 1638 can be formed or etched into the base structure 526. The recesses 1638 can be formed with openings 1628 of the protective layer 306. The protective layer 306 can function as a mask for forming the recesses 1638.

Figure 17:
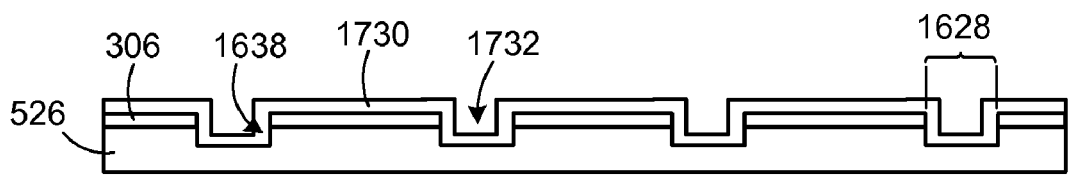
FIG. 17 is the structure of FIG. 16 in a forming step of a conductive layer.

Referring now to FIG. 17, therein is shown the structure of FIG. 16 in a forming step of a conductive layer 1730. The conductive layer 1730 is formed over the protective layer 306 and the base structure 526 filling in the openings 1628 and the recesses 1638. The conductive layer 1730 can form indentations 1732 in the openings 1628 and in the recesses 1638. The conductive layer 1730 can be formed of a single material and layer or can be formed with multiple layers, such as gold (Au), palladium (Pd), nickel (Ni), silver (Ag), tin (Sn), an alloy, or any combination thereof. The conductive layer 1730 can be applied with different processes, such as plating.

Figure 18:
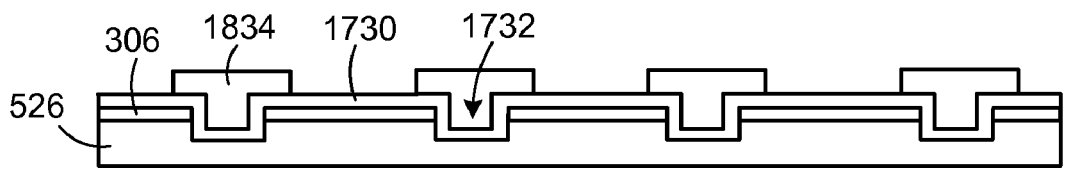
FIG. 18 is the structure of FIG. 17 in a forming step of a mask layer.

Referring now to FIG. 18, therein is shown the structure of FIG. 17 in a forming step of a mask layer 1834. The mask layer 1834, such as photoresist layer, can be patterned over the indentations 1732 of the conductive layer 1730. The mask layer 1834 can fill the indentations 1732. The mask layer 1834 can also be over the protective layer 306 and the base structure 526.

Figure 19:
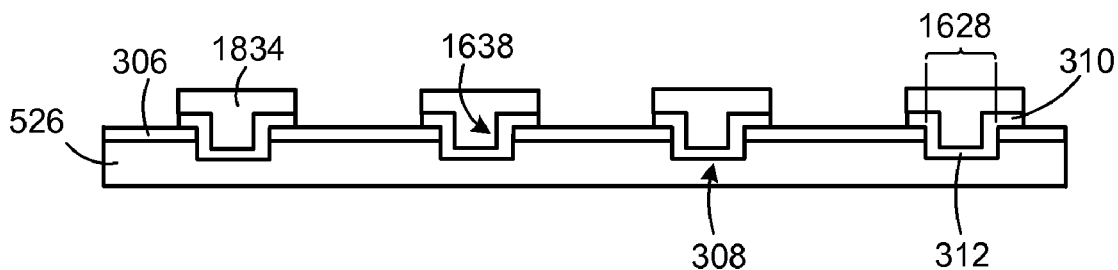
FIG. 19 is the structure of FIG. 18 in a patterning step of the rigid locking leads.

Referring now to FIG. 19, therein is shown the structure of FIG. 18 in a patterning step of the rigid locking leads 308. The mask layer 1834 can be used to form or etch the conductive layer 1730 of FIG. 18 for forming the rigid locking leads 308. The lead locking portion 310 is over the protective layer 306 and below the mask layer 1834. The lead exposed portion 312 is in the openings 1628 of the protective layer 306 and in the recesses 1638 of the base structure 526.

Figure 20:
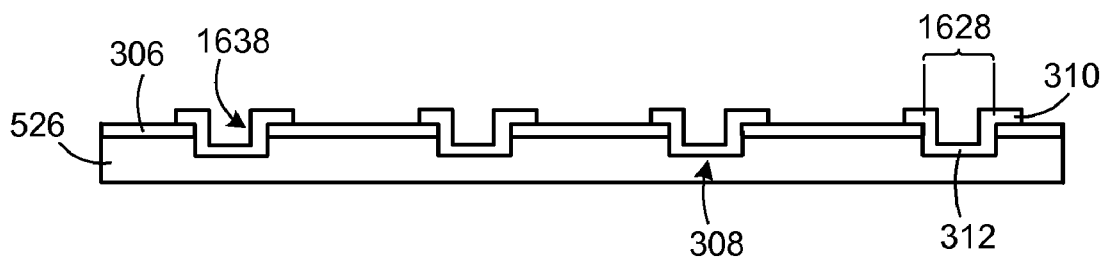
FIG. 20 is the structure of FIG. 19 in an exposing step of the rigid locking leads.

Referring now to FIG. 20, therein is shown the structure of FIG. 19 in an exposing step of the rigid locking leads 308. The mask layer 1834 of FIG. 19 is removed exposing the rigid locking leads 308. As mentioned earlier, the lead locking portion 310 is over the protective layer 306 and the lead exposed portion 312 is within the openings 1628 of the protective layer 306 and in the recesses 1638 of the base structure 526. As an example, the paddle 318 of FIG. 3 can be form in similar process as forming the rigid locking leads 308.

Figure 21:
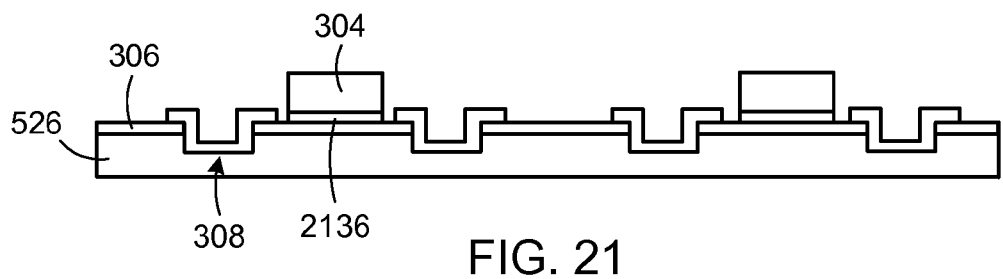
FIG. 21 is the structure of FIG. 20 in a mounting step of the integrated circuit.

Referring now to FIG. 21, therein is shown the structure of FIG. 20 in a mounting step of the integrated circuit 304. The integrated circuit 304 mounts over the protective layer 306 with an adhesive 2136, such as die-attach adhesive or thermal adhesive. The integrated circuit 304 can be between the rigid locking leads 308. The base structure 526 can be below the protective layer 306.

Figure 22:
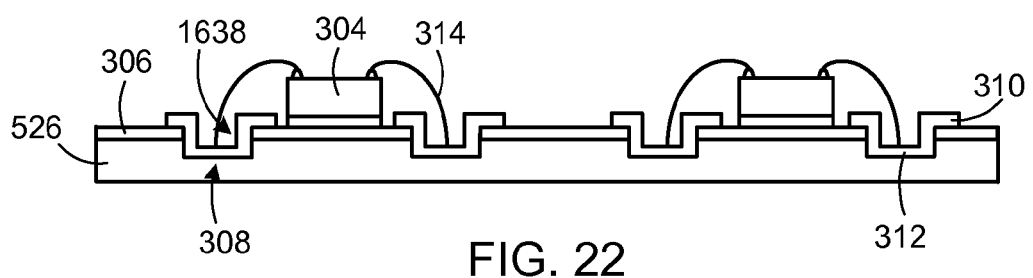
FIG. 22 is the structure of FIG. 21 in a connecting step of the first interconnects.

Referring now to FIG. 22, therein is shown the structure of FIG. 21 in a connecting step of the first interconnects 314. The first interconnects 314 can connect the integrated circuit 304 and the lead exposed portion 312 of the rigid locking leads 308. The lead exposed portion 312 is in the recesses 1638 of the base structure 526. The lead locking portion 310 can be over the protective layer 306.

Figure 23:
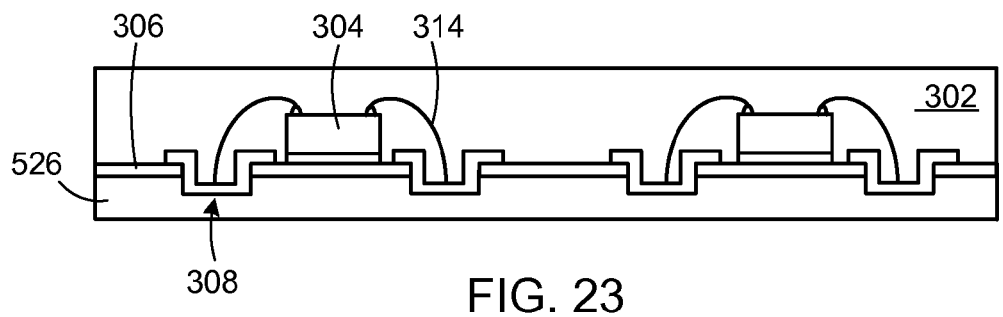
FIG. 23 is the structure of FIG. 22 in a molding step of the encapsulation.

Referring now to FIG. 23, therein is shown the structure of FIG. 22 in a molding step of the encapsulation 302. The encapsulation 302 can be formed over the integrated circuit 304, the first interconnects 314, the rigid locking leads 308, and the protective layer 306. The base structure 526 can be below the protective layer 306.

Figure 24:
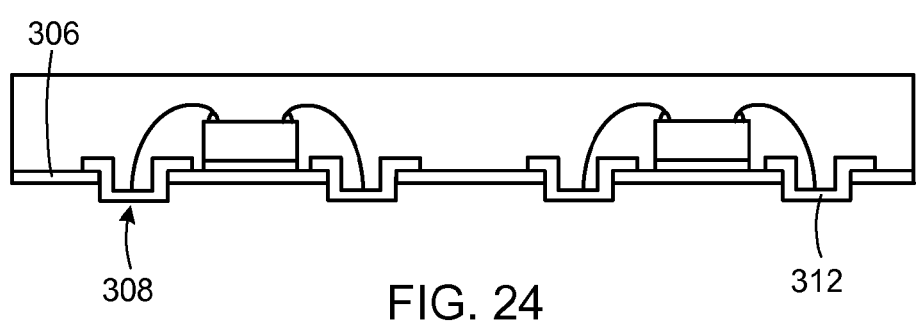
FIG. 24 is the structure of FIG. 23 in an exposing step of the rigid locking leads and the protective layer.

Referring now to FIG. 24, therein is shown the structure of FIG. 23 in an exposing step of the rigid locking leads 308 and the protective layer 306. The base structure 526 of FIG. 23 can be removed exposing the lead exposed portion 312 of the rigid locking leads 308 and the protective layer 306. The lead exposed portion 312 can be non-planar with the protective layer 306 with the rigid locking leads 308 extending below the protective layer 306. The protective layer 306 can function to prevent warpage of the structure without the base structure 526.

Figure 25:
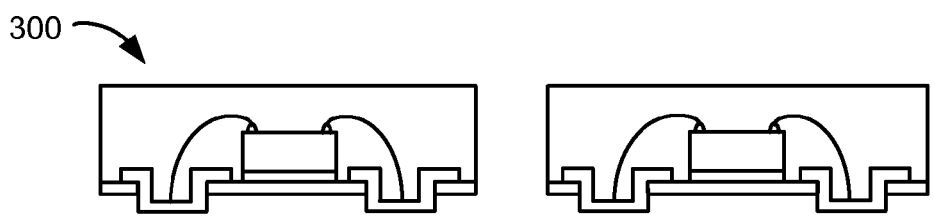
FIG. 25 is the structure of FIG. 24 in a forming step of the integrated circuit package system of FIG. 4.

Referring now to FIG. 25, therein is shown the structure of FIG. 24 in a forming step of the integrated circuit package system 300 of FIG. 4. The structure of FIG. 24 can undergo a singulation process separating the integrated circuit package system 300. The integrated circuit package system 300 is shown without the second interconnects 316 of FIG. 3.

Figure 26:
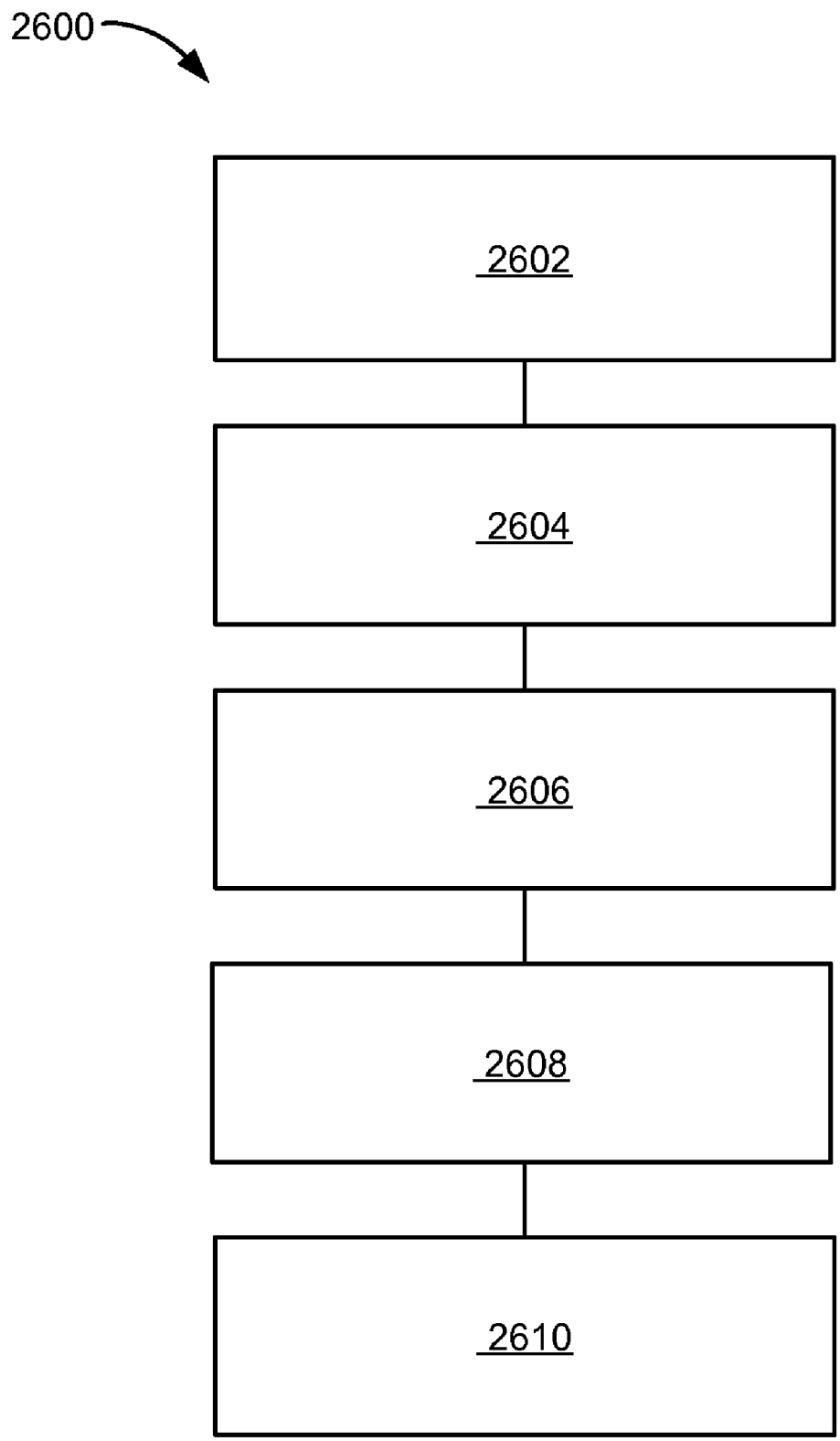
FIG. 26 is a flow chart of an integrated circuit package system for manufacture of the integrated circuit package system in an embodiment of the present invention.

Referring now to FIG. 26, therein is shown a flow chart of an integrated circuit package system 2600 for manufacture of the integrated circuit package system 100 in an embodiment of the present invention. The system 2600 includes providing a protective layer having an opening in a block 2602; forming a conductive layer over the protective layer and filling the opening in a block 2604; patterning a rigid locking lead, having both a lead locking portion and a lead exposed portion, from the conductive layer in a block 2606; connecting an integrated circuit and the rigid locking lead in a block 2608; and forming an encapsulation over the integrated circuit with the lead locking portion in the encapsulation and the lead exposed portion exposed from the encapsulation in a block 2610.

Yet other important aspects of the embodiments include that it valuably supports and services the historical trend of reducing costs, simplifying systems, and increasing performance.

These and other valuable aspects of the embodiments consequently further the state of the technology to at least the next level.

Thus, it has been discovered that the mountable integrated circuit package system of the present invention furnishes important and heretofore unknown and unavailable solutions, capabilities, and functional aspects for improving reliability in systems. The resulting processes and configurations are straightforward, cost-effective, uncomplicated, highly versatile, and effective, can be implemented by adapting known technologies, and are thus readily suited for efficiently and economically manufacturing integrated circuit package devices.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. An integrated circuit package system comprising:
providing a protective layer having a high modulus epoxy compound greater than 19 gigapascals and an opening;
forming a conductive layer over the protective layer and filling the opening;
patterning a rigid locking lead, having both a lead locking portion and a lead exposed portion, from the conductive layer;
connecting an integrated circuit and the rigid locking lead; and
forming an encapsulation over the integrated circuit with the lead locking portion in the encapsulation and the lead exposed portion exposed from the encapsulation.

2. The system as claimed in claim 1 further comprising:
patterning a paddle from the conductive layer; and
mounting the integrated circuit over the paddle.

3. The system as claimed in claim 1 further comprising:
patterning a paddle from the conductive layer; and
connecting the integrated circuit and the paddle.

4. The system as claimed in claim 1 wherein forming the encapsulation includes forming the encapsulation non-planar with the lead exposed portion.

5. An integrated circuit package system comprising:
providing a protective layer having an opening with the protective layer having a high modulus value of greater than 19 gigapascals;
plating a conductive layer over the protective layer and filling the opening;
patterning a rigid locking lead, having both a lead locking portion and a lead exposed portion, from the conductive layer;
connecting an integrated circuit and the rigid locking lead; and
forming an encapsulation over the integrated circuit with the lead locking portion in the encapsulation and the lead exposed portion exposed from the encapsulation.

6. The system as claimed in claim 5 wherein forming the encapsulation includes covering the protective layer.

7. The system as claimed in claim 5 further comprising:
patterning a paddle from the conductive layer;

mounting the integrated circuit over the paddle; and
wherein forming the encapsulation includes:
forming the encapsulation non-planar with the paddle.

8. The system as claimed in claim 5 wherein connecting the integrated circuit and the rigid locking lead includes connecting the integrated circuit and the lead locking portion.

9. The system as claimed in claim 5 wherein forming the encapsulation includes forming the encapsulation coplanar with the protective layer.

10. An integrated circuit package system comprising:
a protective layer having a nigh modulus epoxy molding compound greater than 19 gigapascals and an opening;
a rigid locking lead, having both a lead locking portion and a lead exposed portion, over the protective layer with the lead exposed portion in the opening;
an integrated circuit connected with the rigid locking lead; and
an encapsulation over the integrated circuit with the lead locking portion in the encapsulation and the lead exposed portion exposed from the encapsulation.

11. The system as claimed in claim 10 further comprising a paddle with the integrated circuit mounted thereover.

12. The system as claimed in claim 10 further comprising a paddle with the integrated circuit connected thereto.

13. The system as claimed in claim 10 wherein the encapsulation is non-planar with the lead exposed portion.

14. The system as claimed in claim 10 wherein:
the encapsulation is non-planar with the lead exposed portion; and
the rigid locking lead includes the lead locking portion over the protective layer and the lead exposed portion in the opening.

15. The system as claimed in claim 14 wherein the encapsulation is over the protective layer.

16. The system as claimed in claim 14 further comprising:
a paddle with the integrated circuit mounted thereover; and
wherein the encapsulation is non-planar with the paddle.

17. The system as claimed in claim 14 wherein the integrated circuit connected with the lead locking portion.

18. The system as claimed in claim 14 wherein the encapsulation includes is coplanar with the protective layer.

* * * * *

UNITED STATES PATENT AND TRADEMARK OFFICE
CERTIFICATE OF CORRECTION

| | | |
|---|---|---|
| PATENT NO. | : 7,872,345 B2 | Page 1 of 1 |
| APPLICATION NO. | : 12/055642 | |
| DATED | : January 18, 2011 | |
| INVENTOR(S) | : Chow et al. | |

It is certified that error appears in the above-identified patent and that said Letters Patent is hereby corrected as shown below:

Column 10:
    Claim 1, lines 29-30, delete "epoxy compound" and insert therefor --epoxy molding compound--

Column 11:
    Claim 10, line 11, delete "nigh" and insert therefor --high--

Signed and Sealed this
Seventeenth Day of May, 2011

David J. Kappos
*Director of the United States Patent and Trademark Office*